United States Patent
Jamshidi et al.

(10) Patent No.: US 6,952,118 B2
(45) Date of Patent: Oct. 4, 2005

(54) GATE-CLOCKED DOMINO CIRCUITS WITH REDUCED LEAKAGE CURRENT

(75) Inventors: Shahram Jamshidi, Cupertino, CA (US); Sudarshan Kumar, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 37 days.

(21) Appl. No.: 10/324,307

(22) Filed: Dec. 18, 2002

(65) Prior Publication Data

US 2004/0119503 A1 Jun. 24, 2004

(51) Int. Cl.[7] .............................................. H03K 19/096
(52) U.S. Cl. ......................................... 326/98; 326/112
(58) Field of Search .............................. 326/93, 95, 98, 326/112, 119, 121; 365/203

(56) References Cited

U.S. PATENT DOCUMENTS

| | | |
|---|---|---|
| 5,598,114 A | 1/1997 | Jamshidi |
| 5,625,303 A | 4/1997 | Jamshidi |
| 5,646,558 A | 7/1997 | Jamshidi |
| 5,982,197 A * | 11/1999 | Ono et al. ..................... 326/95 |
| 6,229,340 B1 * | 5/2001 | Hagihara ..................... 326/93 |
| 6,429,689 B1 * | 8/2002 | Allen et al. .................. 326/95 |
| 6,707,318 B2 | 3/2004 | Kumar et al. |
| 6,732,136 B1 | 5/2004 | Chen et al. |
| 2004/0194037 A1 | 9/2004 | Jamshidi et al. |
| 2004/0252574 A1 | 12/2004 | Jamshidi |

OTHER PUBLICATIONS

Pending U.S. Appl. No. 09/044,392, P5042, entitled: "Domino-Logic Gates With Improved Noise Immunity", filed on Mar. 18, 1998.

* cited by examiner

*Primary Examiner*—James H. Cho
(74) *Attorney, Agent, or Firm*—Jeffrey B. Huter

(57) ABSTRACT

A gate-clocked domino circuit with reduced leakage current during an inactive state, where domino stages in the domino circuit have long channel length transistors in the pre-charge paths. During an inactive state, the domino stages are put in an evaluation state and are discharged.

25 Claims, 4 Drawing Sheets

US 6,952,118 B2

GATE-CLOCKED DOMINO CIRCUITS WITH REDUCED LEAKAGE CURRENT

FIELD

The present invention relates to digital circuits, and more particularly, to domino logic circuits with reduced current leakage.

BACKGROUND

Domino (or dynamic) logic circuits are often employed in high performance systems. For example, consider a computer system, such as that illustrated in FIG. 1. In FIG. 1, microprocessor die 102 comprises many sub-blocks, such as arithmetic logic unit (ALU) 104 and on-chip cache 106. Microprocessor 102 may also communicate to other levels of cache, such as off-chip cache 108. Higher memory hierarchy levels, such as system memory 110, are accessed via host bus 112 and chipset 114. In addition, other off-chip functional units, such as graphics accelerator 116 and network interface controller (NIC) 118, to name just a few, may communicate with microprocessor 102 via appropriate busses or ports.

Some or all of the functional units making up a computer system as described above may comprise domino logic circuits. Some of these domino circuits may employ clock gating, where they are put into an inactive state when not needed so as to reduce wasted power. However, for deep sub-micron process technology, wasted power due to current leakage may nevertheless present problems in clock gated domino circuits if not properly taken into account. Various techniques have been proposed for reducing leakage current, such as, for example, using dynamic threshold scaling or providing multiple supply voltages. Such techniques often introduce a performance penalty or additional hardware cost and complexity. The use of long channel length transistors in clock-gated domino circuits has also been contemplated for reducing current leakage. However, to the best of our knowledge, such previously considered techniques for using long channel length transistors in clock gated domino logic circuits have introduced a penalty in performance.

DESCRIPTION OF EMBODIMENTS

By clock gating during an evaluation phase instead of a pre-charge phase, and by utilizing long channel length transistors in the pre-charge path, embodiments of the present invention achieve leakage reduction in domino logic blocks without introducing any significant performance loss. A domino logic stage in an embodiment of the present invention at the circuit level is provided in FIG. 2. In practice, more than one such domino logic stage is usually used in a domino logic block.

Figure 1:
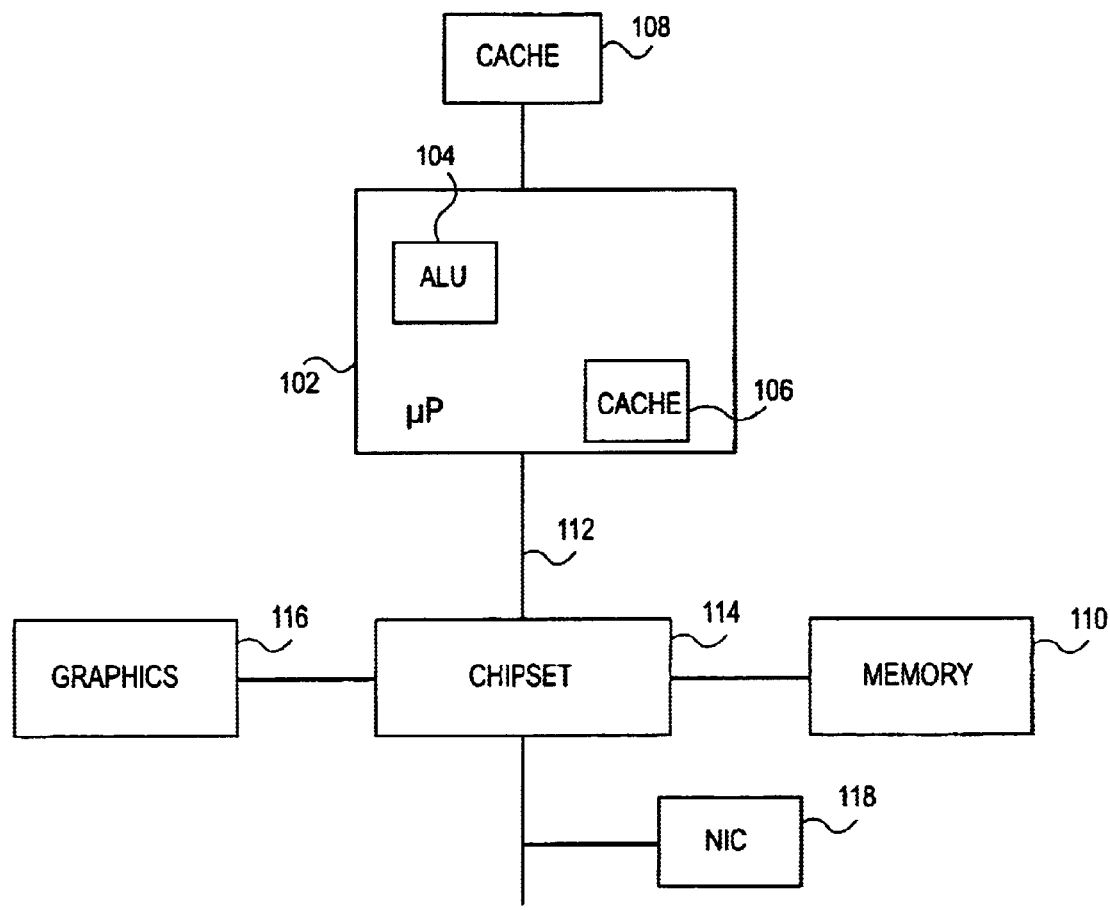
FIG. 1 is a high-level diagram of a computer system.
Figure 2:
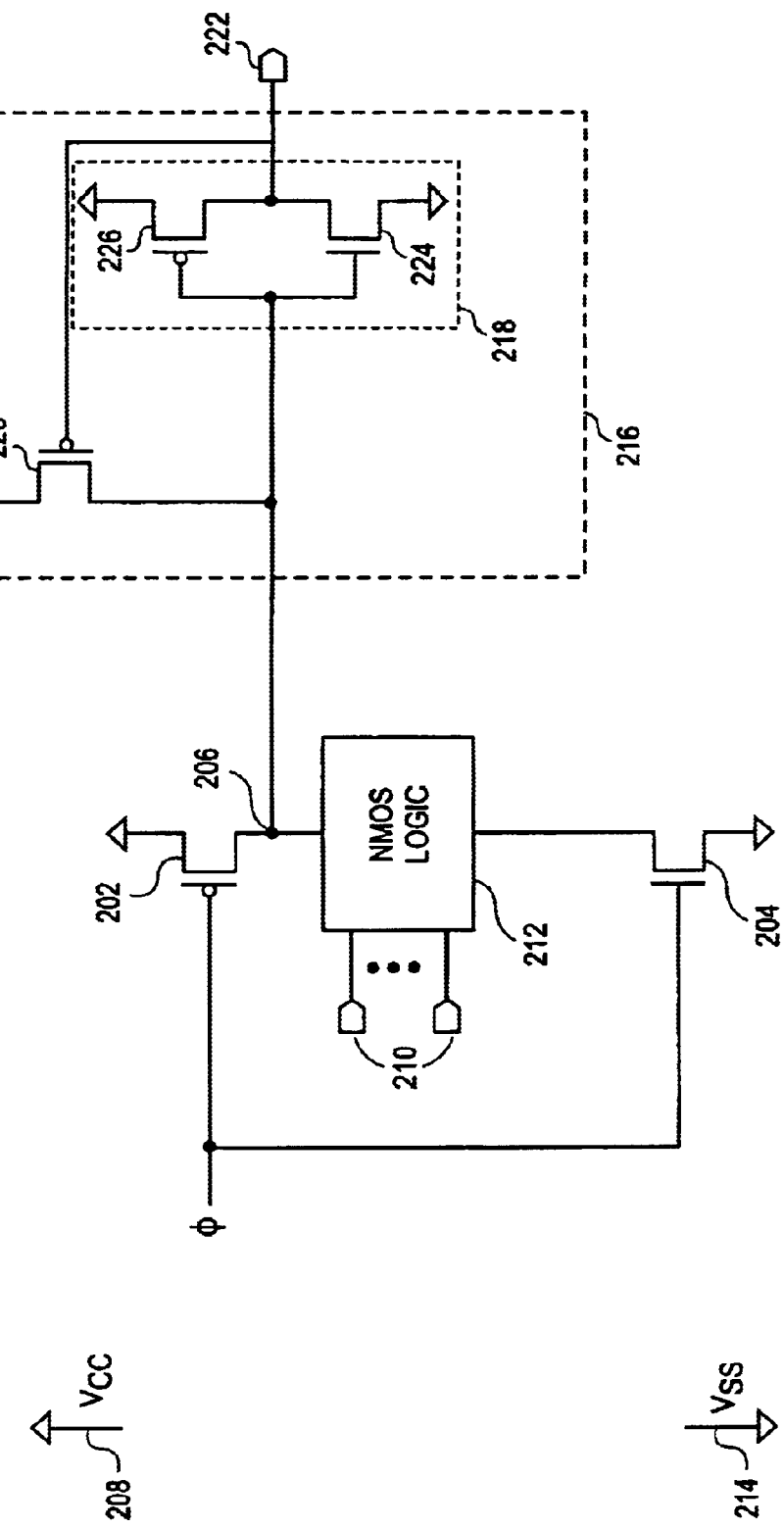
FIG. 2 is a domino logic stage in an embodiment of the present invention.

In FIG. 2, the clock signal is represented by ϕ. During a pre-charge phase, the clock signal is LOW so that pull-up pMOSFET (p-Metal Oxide Semiconductor Field Effect Transistor) 202 is ON and nMOSFET 204 is OFF. With pMOSFET 202 ON, a low impedance path is provided between node 206 and supply rail 208 to charge node 206 HIGH ($V_{CC}$). During an evaluation phase, the clock signal is HIGH so that pMOSFET 202 is OFF and nMOSFET 204 is ON. Depending upon the input voltages at input ports 201, the combination of nMOS pull-down logic 212 and nMOSFET 204 provides a conditional low impedance path between node 206 and supply rail 214. In this way, node 206 is conditionally pulled LOW ($V_{SS}$) during an evaluation phase, depending upon the input voltages.

Half-keeper 216, comprising inverter 218 and pull-up pMOSFET 220, is sized to ideally maintain node 206 HIGH during an evaluation phase unless it is otherwise pulled LOW by nMOS pull-down logic 212 and nMOSFET 204. (Logic gates other than inverter 218, such as a NOR gate, may be utilized in half-keeper 216.) Upon completing an evaluation, the output signal at output port 222 propagates through other domino logic stages (not shown) and is eventually captured by a latch or other dynamic stage. The logic function realized by the domino stage of FIG. 2 depends upon the particular combination of nMOSFETs (not shown) making up n-MOS pull-down logic 212.

The domino stage of FIG. 2 may be used as a boundary stage because of the presence of pull-down nMOSFET 204, which isolates node 206 from supply rail 214 during a pre-charge phase regardless of the input voltages to nMOS pull-down logic 212. For a domino stage not on a boundary, a pull-down nMOSFET between its nMOS pull-down logic and supply rail 214 may not be needed provided its input voltages are LOW during a pre-charge phase. Note that the output voltage at output port 222 is LOW during a pre-charge phase, so that output port 222 may drive the input ports of non-boundary type domino stages.

It is to be understood that the term "supply rail" as used in the above discussion is in general some kind of conductive material, such as a copper interconnect, power plane, doped polysilicon, or the integrated circuit substrate itself upon which the circuit of FIG. 2 is formed. The voltage $V_{SS}$ of supply rail 214 may not necessarily refer to the substrate voltage, and it may not necessarily be a ground voltage by which other voltages are referenced to.

Pull-up pMOSFET 202, pull-up pMOSFET 220, and pull-down nMOSFET 224 are sized to have long channel lengths. That is, the particular technology used to create the circuit of FIG. 2 on die 102 supports some minimum channel length $L_0$, and a long channel length L is larger than $L_0$, where $L=(1+r)L_0$. As one example, r=0.05, so that L is 5% larger than the minimum channel length $L_0$. Note that transistors 202, 220, and 224 are in the pre-charge paths of the domino stage. That is, when the domino stage of FIG. 2 is in a pre-charge phase, pMOSFET 202 is ON so that node 206 is pulled HIGH, which in turn causes nMOSFET 224 to turn ON to pull node 222 LOW, and causes pMOSFET 220 to turn ON. Because the pre-charge path is a non-critical path, it is expected that using long channel length transistors in the pre-charge paths should not penalize performance.

For an embodiment of the present invention, when a domino block is placed in an inactive state, the clock signal for each domino stage making up the domino block is gated so that it is HIGH, and each domino stage within the domino block is put into a discharged state. In this way, leakage current during an inactive state is reduced. One method to discharge all the stages in a domino block, is to discharge the boundary stages, which will cause all subsequent domino stages in the domino block to discharge. One way to discharge a boundary stage during an inactive stage is to ensure that its input voltages are maintained HIGH. This will be described in more detail below with reference to FIG. 2.

Suppose the domino stage of FIG. 2 is a boundary stage. If during an inactive state the input voltages at input ports 210 are maintained HIGH, then node 206 will discharge (if it has not already been discharged) because pull-up pMOSFET 202 will be OFF and nMOS pull-down logic 212 and pull-down nMOSFET 204 will both be ON. Consequently, nMOSFET 224 is OFF and pMOSFET 226 is ON, which in turn ensures that pull-up pMOSFET 220 is OFF and output port 222 HIGH. The only transistors having a non-zero drain-source voltage are precisely those transistors in the pre-charge path, i.e., transistors 202, 224, and 220. But because these transistors are all OFF and have long channel lengths, leakage current is significantly reduced when compared to the case in which they are not sized to have long channel lengths. Furthermore, note that because output port 222 is HIGH, the input port of the next domino stage connected to output port 222 will be HIGH. Consequently, discharging the boundary stages in a domino block will cause all subsequent domino stages to discharge during an inactive state.

Figure 3:
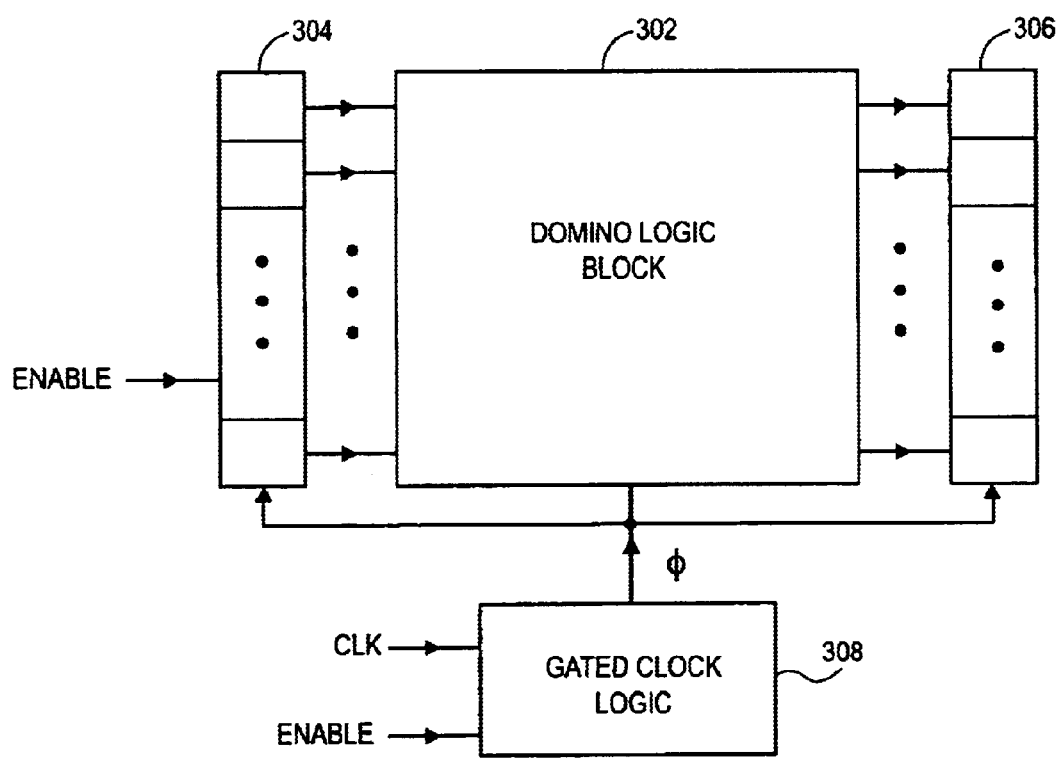
FIG. 3 is a high-level abstraction of an embodiment of the present invention.

A high-level abstraction of an embodiment of the present invention is provided in FIG. 3, showing domino logic block 302, a bank of sampling elements 304 for providing input voltages to domino logic block 302, a bank of sampling elements 306 for latching the output voltages of domino logic block 302, and gated clock logic 308. A clock signal and enable signal is provided to gated clock logic 308. Gated clock logic 308 provides the gated clock signal φ, where the gated clock signal φ is held HIGH when the enable signal indicates that domino logic block 302 is to be put in its inactive state. The gated clock signal φ and enable signal are provided to sampling elements 304. The voltages latched by sampling elements 304 are set HIGH when the enable signal indicates that domino logic block 302 is to be put in its inactive state, so that the domino stages in domino logic block 302 are discharged as discussed earlier.

Figure 4:
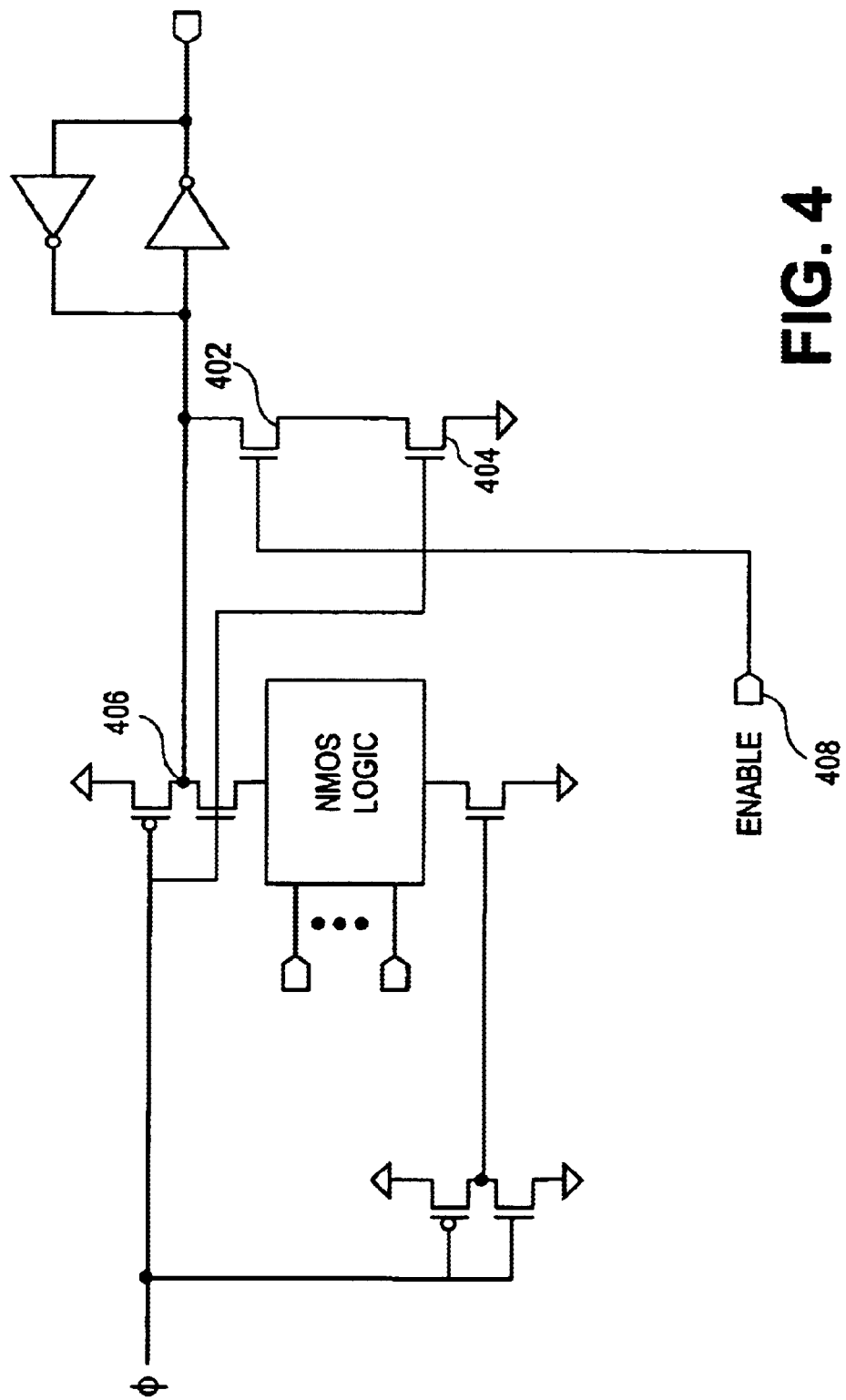
FIG. 4 is a static-to-domino latch in an embodiment of the present invention.

For the embodiment of FIG. 3, sampling elements 304 may be realized by any number of known latches compatible with domino logic, modified so that the latched voltages are forced HIGH when the enable signal indicates an inactive state. These modifications are relatively straightforward. As one example, a static-to-domino sampling element is shown in FIG. 4, where pull-down nMOSFETs 402 and 404 discharge node 406 when both the enable signal at port 408 and the clock signal φ are HIGH.

Various modifications may be made to the disclosed embodiments without departing from the scope of the invention as claimed below. For an example, in other embodiments, sampling elements 304 may be any known latch compatible with domino logic, where the latched voltages need not be HIGH provided the boundary domino stages are forced to discharge during an inactive state when the clock signal is gated HIGH. Discharging a domino stage is straightforward. For example, for the domino stage of FIG. 2, pull-down nMOSFETs may be introduced between node 206 and supply rail 214, similar to nMOSFETs 402 and 404 in FIG. 4, to discharge node 206 when the clock signal is gated HIGH and the enable signal indicates an inactive state.

As another example, in other embodiments, not all of transistors 202, 224, and 220 in a domino stage may be long channel length transistors. For example, transistors 202 and 224 may be long channel length transistors, but transistor 220 may not be a long channel length transistor. More generally, it is not necessary that each channel for transistors 202, 224, and 220 have the same length. Furthermore, even without using long channel length transistors, leakage current may nevertheless be reduced by discharging the domino stage and putting it in an evaluation phase during an inactive state. That is, in other embodiments, pMOSFET 202, pMOSFET 220, and nMOSFET 224 may have the same channel lengths as other transistors, but where the clock is gated so that the domino stage is in an evaluation phase when inactive, and where the domino stage is discharged when put into its inactive state.

What is claimed is:

1. An integrated circuit die comprising a domino stage having an evaluation phase, a pre-charge phase, and an inactive state, the domino stage comprising:
   a first supply rail;
   a second supply rail;
   a node;
   a nMOS pull-down logic comprising a set of input ports, each input port having an input voltage;
   a first pull-down nMOSFET connected to the nMOS pull-down logic so that during an evaluation phase a conditional low impedance path is provided between the node and the second supply rail depending upon the set of input port voltages;
   a first pull-up pMOSFET connected to the node so that a low impedance path is provided between the node and the first supply rail when the domino stage is in a pre-charge phase; and
   a discharge logic to discharge the node when in an inactive state and to force the input port voltages HIGH when the domino stage is in an inactive state.

2. An integrated circuit die comprising a domino stage having an evaluation phase, a pre-charge phase, and an inactive state, the domino stage comprising:
   a first supply rail;
   a second supply rail;
   a node;
   a nMOS pull-down logic comprising a set of input ports, each input port having an input voltage;
   a first pull-down nMOSFET connected to the nMOS pull-down logic so that during an evaluation phase a conditional low impedance path is provided between the node and the second supply rail depending upon the set of input port voltages; and
   a first pull-up pMOSFET connected to the node so that a low impedance path is provided between the node and the first supply rail when the domino stage is in a pre-charge phase;
   a gated clock logic to put the domino stage into an evaluation phase when in an inactive state; and
   a discharge logic to discharge the node when in an inactive state, wherein the discharge logic forces the input port voltages HIGH when the domino stage is in an inactive state.

3. An integrated circuit die comprising a domino stage having an inactive state and a set of input ports, each input port having an input voltage, the integrated circuit comprising:
   a gated clock logic to put the domino stage into an evaluation phase when in an inactive state; and
   a discharge logic to discharge the node when in an inactive state, and to force the input port voltages HIGH when the domino stage is in an inactive state.

4. The integrated circuit die of claim 3 wherein the gated clock logic further defines a pre-charge phase, and the integrated circuit die further comprises pre-charge logic to pre-charge the node in response to a pre-charge phase.

5. The integrate circuit die of claim 3 further comprising conditional logic to conditionally discharge the node based upon input voltages of the set of input ports.

6. The integrate circuit die of claim 3 further comprising conditional logic to conditionally discharge the node based upon input voltages of the set of input ports, and output logic to generate an output that depends upon status of the node.

7. The integrated circuit die as set forth in claim 1, the domino stage further comprising a gate, the gate comprising an input port connected to the node;

an output port; and a second pull-down nMOSFET connected to the node and the output port of the gate so that a low impedance path is provided between the output port of the gate and the second supply rail when the node is HIGH.

8. The integrated circuit die as set forth in claim 7, further comprising a second pull-up pMOSFET connected to the node so that a low impedance path is provided between the node and the first supply rail if the output port of the gate is LOW.

9. The integrate circuit die as set forth in claim 8, wherein the first pull-up pMOSFET, the second pull-down nMOSFET, and the second pull-up pMOSFET each has a long channel length.

10. The integrated circuit die as set forth in claim 2, the domino stage further comprising a gate, the gate comprising an input port connected to the node;

and output port; and a second pull-down nMOSFET connected to the node and the output port of the gate so that a low impedance path is provided between the output port of the gate and the second supply rail when the node is HIGH.

11. The integrated circuit die as set forth in claim 10, further comprising a second pull-up pMOSFET connected to the node so that a low impedance path is provided between the node and the first supply rail if the output port of the gate is LOW.

12. The integrate circuit die as set forth in claim 10, wherein the first pull-up pMOSFET, the second pull-down nMOSFET, and the second pull-up pMOSFET each has a channel length greater than a minimum channel length of the integrated circuit die.

13. The integrate circuit die as set forth in claim 10, wherein the first pull-up pMOSFET, the second pull-down nMOSFET, and the second pull-up pMOSFET each has a channel length that is at least 5% longer than a minimum channel length of the integrated circuit die.

14. An integrated circuit comprising a pre-charge logic to pre-charge a node via a low impedance path to a first supply voltage in response to a pre-charge phase;

a conditional logic to conditionally discharge the node via a low impedance path to a second supply voltage based upon a set of inputs of the conditional logic in response to an evaluation phase; and a discharge logic to force the inputs to values that cause the conditional logic to discharge the node via the low impedance path to the second supply voltage in response to an inactive state.

15. The integrated circuit of claim 14 further comprising a gated clock logic to define an evaluation phase and a pre-charge phase in response to a signal indicative of an active state and to force an evaluation phase in response to a signal indicative of an inactive state.

16. The integrated circuit of claim 14 further comprising output logic to generate an output that depends upon status of the node.

17. The integrated circuit of claim 14, wherein the pre-charge logic comprises a transistor that provides a low impedance path to the first supply voltage in response to a pre-charge phase, wherein the transistor comprises a channel length that is greater than a minimum channel length of the integrated circuit.

18. The integrated circuit of claim 14, further comprising a transistor that provides a low impedance path between the conditional logic and the second supply voltage in response to an evaluation phase, wherein the transistor comprises a channel length that is greater than a minimum channel length of the integrated circuit.

19. The integrated circuit of claim 14, wherein the conditional logic comprises pull down transistors, and the discharge logic forces the inputs HIGH in response to an inactive state.

20. A method comprising pre-charging a node during a pre-charge phase, generating an output that is dependent upon whether conditional logic discharges the node during an evaluation phase, and forcing the conditional logic to discharge the node during an inactive state.

21. The method of claim 20 wherein pre-charging comprises turning on a transistor coupled between the node and a first supply rail during the pre-charge phase.

22. The method of claim 20 wherein forcing comprising applying voltages to inputs of the conditional logic that create a low impedance path between the node and a second supply rail during an inactive state.

23. The method of claim 20 further comprising applying voltages to inputs of the conditional logic during the evaluation phase, wherein generating comprises conditionally providing a low impedance path through the conditional logic based upon the voltages to the inputs.

24. The method of claim 20 wherein forcing comprises applying a HIGH voltage to inputs of the conditional logic.

25. The method of claim 20 further comprising applying voltages to inputs of the conditional logic during the evaluation phase, wherein generating comprises conditionally providing a low impedance path through the conditional logic based upon the voltages to the inputs, and forcing comprises applying a HIGH voltage to inputs of the conditional logic.

* * * * *

UNITED STATES PATENT AND TRADEMARK OFFICE
CERTIFICATE OF CORRECTION

PATENT NO. : 6,952,118 B2
DATED : October 4, 2005
INVENTOR(S) : Jamshidi et al.

It is certified that error appears in the above-identified patent and that said Letters Patent is hereby corrected as shown below:

Column 5,
Line 34, delete the first occurrence of "and" and insert -- an --.

Signed and Sealed this

Thirteenth Day of December, 2005

JON W. DUDAS
*Director of the United States Patent and Trademark Office*